United States Patent
Hershberg et al.

(10) Patent No.: US 11,271,580 B2
(45) Date of Patent: Mar. 8, 2022

(54) APPARATUS AND METHOD FOR ON-CHIP RECONSTRUCTION OF TRANSIENT SETTLING BEHAVIOR

(71) Applicant: IMEC VZW, Leuven (BE)

(72) Inventors: Benjamin Hershberg, Leuven (BE); Nereo Markulic, Etterbeek (BE); Jorge Luis Lagos Benites, Heverlee (BE); Jan Craninckx, Boutersem (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 17/125,809

(22) Filed: Dec. 17, 2020

(65) Prior Publication Data
US 2021/0194493 A1 Jun. 24, 2021

(30) Foreign Application Priority Data
Dec. 19, 2019 (EP) .................... 19217958

(51) Int. Cl.
H03M 1/12 (2006.01)
(52) U.S. Cl.
CPC .................. H03M 1/1245 (2013.01)
(58) Field of Classification Search
CPC ................................. H03M 1/1245
USPC ................. 341/118, 120, 155, 122
See application file for complete search history.

(56) References Cited

U.S. PATENT DOCUMENTS

| 4,157,035 A | 6/1979 | Doll et al. |
| 4,352,194 A * | 9/1982 | Caracappa .......... H04L 27/1566 329/327 |
| 4,733,191 A | 3/1988 | Doll |
| 6,992,466 B2 | 1/2006 | Chadwick et al. |
| 8,519,875 B2 | 8/2013 | Straayer et al. |
| 9,136,856 B1 | 9/2015 | El-Chammas |
| 9,503,116 B2 | 11/2016 | Speir et al. |

(Continued)

FOREIGN PATENT DOCUMENTS

DE 3831678 A1 3/1990

OTHER PUBLICATIONS

ElShater, Ahmed, Praveen Kumar Venkatachala, Calvin Yoji Lee, Jason Muhlestein, Spencer Leuenberger, Kazuki Sobue, Koichi Hamashita, and Un-Ku Moon. "A 10-mw 16-b 15-ms/s two-step sar adc with 95-db dr using dual-deadzone ring amplifier." IEEE International Solid-State Circuits Conference. (2019) 3 pages.

(Continued)

*Primary Examiner* — Peguy Jean Pierre
(74) *Attorney, Agent, or Firm* — McDonnell Boehnen Hulbert & Berghoff LLP

(57) ABSTRACT

An apparatus is provided for on-chip reconstruction of transient settling behavior. The apparatus comprises a first sampling circuit configured to sample a tracked analog signal output from a circuit under test over an operating period at a first sampling time, thereby generating a first sample output. In addition, the apparatus comprises a second sampling circuit configured to sample the tracked analog signal output at a second sampling time, thereby generating a second sample output. The apparatus further comprises a signal subtraction circuit configured to perform subtraction of the first sample output and the second sample output, thereby generating a difference signal. Moreover, the apparatus comprises a signal conversion circuit configured to output the difference signal in the digital domain.

18 Claims, 10 Drawing Sheets

(56) References Cited

U.S. PATENT DOCUMENTS

2013/0208264 A1* 8/2013 Ahadian ............ G01M 11/3145
356/73.1
2019/0305791 A1 10/2019 Ali et al.

OTHER PUBLICATIONS

Extended European Search Report and Written Opinion, EP Application No. 19217958.8, dated Jun. 9, 2020, 11 pages.
Ali et al. "A 15b 1GS/s RF Sampling Pipelined ADC with Backgrounf Calibration", ISSCC 2014 / Session 29 / Data Converters for Wireless Systems / 29.3, 2014, pp. 482-484.
Peng, Xizhu, Shuaishuai Shi, QingQing Bao, Shengpu Niu, and He Tang. "A 1GSps RF sampling pipelined ADC with novel background digital calibration." In 2018 IEEE MTT-S International Wireless Symposium (IWS), pp. 1-3. IEEE, 2018.
Oshima, Takashi, Tomomi Takahashi, and Taizo Yamawaki. "Novel sampling timing background calibration for time-interleaved A/D converters." In 2009 52nd IEEE International Midwest Symposium on Circuits and Systems, pp. 361-364. IEEE, 2009.

* cited by examiner

APPARATUS AND METHOD FOR ON-CHIP RECONSTRUCTION OF TRANSIENT SETTLING BEHAVIOR

CROSS-REFERENCE TO RELATED APPLICATIONS

The present application is a non-provisional patent application claiming priority to European Patent Application No. 19217958.8, filed Dec. 19, 2019, the contents of which are hereby incorporated by reference.

FIELD OF THE DISCLOSURE

The application relates to on-chip reconstruction of transient settling behavior. In particular, this application relates to foreground and background monitoring of transient settling behavior of an amplifier in a discrete-time switched capacitor circuit.

BACKGROUND

Generally, the performance monitoring and behavioral analysis for a switched capacitor circuit, for instance, an analog to digital converter (ADC), can be performed by either foreground or background techniques. The background monitoring techniques facilitate additional robustness and flexibility because the circuit remains in its normal mode of operation while monitoring is being performed. In addition, the background monitoring techniques allow for cost-effective on-the-fly calibration of the circuit across process, voltage, or temperature (PVT) variations.

Furthermore, in circuit design, it is possible to simulate the transient operation of a circuit and to use knowledge of the resulting transient waveforms to optimize the circuit design or to find the correct biasing. Due to the virtualization of a simulated environment, there is full observability of all nodes in the system. In-circuit test and measurement, it is also possible to acquire similar transient waveform data for certain externals observable ports that can be probed by an oscilloscope, and to use this information to optimize the behavior of a circuit through analog or digital tuning adjustments.

However, the requirement that the node be externally observable makes this impractical for most high-speed integrated circuits, because it becomes impractical to buffer an internal analog signal to an external pad with high precision and high bandwidth. Moreover, this is only practically useful for test and measurement applications, not for industrialization. In mass production, it is not practical to do such external probing due to the cost and size of the measurement equipment, and the time required to do the measurement. Rather, the integrated circuit must be able to configure and optimize itself internally.

For example, Ahmed ElShater, et al., "A 10-mW 16-b 15-MS/s Two-Step SAR ADC with 95-dB DR using Dual-Deadzone Ring Amplifier", IEEE Journal of Solid-State Circuits, Volume 54, Issue 12, December 2019, pp. 3410-3420; discloses an on-chip circuit monitoring technique. In particular, the technique utilizes a scope-on-chip to measure the settling behavior of a ring amplifier. However, the monitoring is limited to only foreground monitoring, where a high-resolution quantizer is utilized due to the necessity for quantizing the full output range.

SUMMARY

Accordingly, an aspect of the application provides an apparatus that facilitates cost-effective and lightweight monitoring and a method of operation of the apparatus, which can be implemented on-chip alongside the integrated circuit of interest.

In a first aspect, an apparatus is provided for on-chip reconstruction of transient settling behavior. The apparatus comprises a first sampling circuit configured to sample a tracked analog signal output from a circuit under test over a transient settling period of the circuit under test at a first sampling time, thereby generating a first sample output. In addition, the apparatus comprises a second sampling circuit configured to sample the tracked analog signal output at a second sampling time, thereby generating a second sample output. In this context, the first sampling time is tunable over the operating period at a plurality of sampling moments in time, and the second sampling time is fixed at an endpoint of the operating period.

The apparatus further comprises a signal subtraction circuit configured to perform subtraction of the first sample output and the second sample output, thereby generating a difference signal. Moreover, the apparatus comprises a signal conversion circuit configured to output the difference signal in the digital domain.

Therefore, the first sampling circuit samples the output, e.g., a voltage of the circuit under test at certain intermediate points throughout the circuit operation, and the second sampling circuit samples the final settled output voltage. The relative comparison between the intermediate and final values effectively subtracts the settled signal value and only compares the relative difference between them. This facilitates performing quantization of the difference signal by a relatively simple signal conversion circuit. Thus, it is possible to reconstruct a digitized representation of the transient settling behavior of the circuit under test without significantly reducing the performance requirements for on-chip monitoring.

In a first implementation of the first aspect, the first sample output and the second sample output are repeatedly generated and recombined across a plurality of operating periods, thereby reconstructing the transient settling behavior of the circuit under test. In this context, the input to the circuit under test is, in an example, similar for the plurality of operating periods, such that the output settling behavior of the circuit under test will be nearly identical across the plurality of cycles.

In a second implementation of the first aspect, the circuit under test is an integrated circuit, and in some examples, a discrete-time switched capacitor circuit comprising an amplifier, whereby the apparatus is configured to be implemented in-situ alongside the integrated circuit.

In a further implementation of the first aspect, the tracked analog signal output corresponds to a transient waveform output from the amplifier of the circuit under test with similar input conditions. Furthermore, the first sample output represents a transient value at an arbitrary time instant, and the second sample output represents a final transient value of the transient waveform over the operating period. It is possible to vary the first sampling time across multiple periods where similar or similar-enough signal is present at the output of the circuit under test, thereby reconstructing the transient waveform of the circuit under test.

In a further implementation of the first aspect, the signal conversion circuit is an analog to digital converter. This allows a lightweight solution for on-chip monitoring.

In a further implementation of the first aspect, the analog to digital converter is realized in the form of a single comparator having a first input and a second input, respectively conveying the first sample output and the second sample output. The signal conversion is performed in a cost-effective and simplified manner.

In a further implementation of the first aspect, the apparatus further comprises a controller configured to provide the first sampling time and the second sampling time in order to operate the first sampling circuit and the second sampling circuit, respectively. Preferably, the controller includes logic and timing circuitry for generating the sampling times and thereby operating the first and second sampling circuit.

In this context, the controller may generate the first sampling time by means of a programmable time delay. In addition, the controller may generate the second sampling time based on the operating period of the circuit under test. In particular, the second sampling time can be generated in correspondence to the overall sampling time provided for the integrated circuit.

In a further implementation of the first aspect, the first sampling circuit and the second sampling circuit each comprises at least one sampling switch and at least one sampling capacitor.

In a further implementation of the first aspect, the sampling capacitors are formed with signal lines conveying the tracked analog signal output from the circuit under test. Therefore, the sampling capacitors are realized by means of wire capacitors, which leads to a very compact layout. As a result, any additional capacitive loading on the circuit under test, especially caused by the monitoring apparatus can be effectively minimized.

In a second aspect, a method is provided for on-chip reconstruction of transient settling behavior. The method comprises sampling a tracked analog signal output from a circuit under test over an operating period at a first sampling time, thereby generating a first sample output. In addition, the method comprises sampling the tracked analog signal output at a second sampling time, thereby generating a second sample output. The method further comprises performing subtraction of the first sample output and the second sample output, thereby generating a difference signal. Moreover, the method comprises outputting the difference signal in the digital domain.

In a first implementation of the second aspect, the first sampling time is tunable over the operating period at a plurality of sampling moments in time, and the second sampling time is fixed at an end point of the operating period. Furthermore, the method further comprises repeatedly generating and combining the sampling outputs across a plurality of operating periods, thereby reconstructing the transient settling behavior of the circuit under test. Therefore, it is possible to reconstruct a digitized representation of the transient settling behavior of the circuit under test that significantly reduces the performance requirements for on-chip monitoring. Furthermore, in addition to the reconstruction of the settling behavior of the circuit under test, the repetitive/iterative generation of the sample outputs and the averaging of the sample outputs further allows for noise filtration during the monitoring of the circuit under test.

In a second implementation of the second aspect, the method further comprises generating the first sample output and the second sample output for a similar input to the circuit under test. It is possible to vary the first sampling time across multiple periods where a similar signal is present, thereby reconstructing the transient waveform of the circuit under test.

In a further implementation of the second aspect, the method further comprises generating the first sample output and the second sample output for random inputs to the circuit under test, whereby the sample outputs are binned according to their level, and the averaging is performed per bin. Hence, the monitoring is further performed for random inputs to the circuit under test, where the sample outputs are binned or grouped as per their level in the output range, and the averaging is done per bin, which additionally allows for noise filtration.

These aspects and implementations provide a general method for on-chip reconstruction of transient settling behavior that relaxes the performance requirements for on-chip monitoring significantly. The method is not limited to the nature of the input acting on the circuit under test. The only requirement is a constant or sufficiently-similar final settled value that can be achieved by applying similar input to the circuit under test, thereby facilitating foreground monitoring. Additionally, the input to the circuit under test can be random in nature, where the output settled value is binned, thereby facilitating background monitoring.

BRIEF DESCRIPTION OF THE FIGURES

The above, as well as additional features, will be better understood through the following illustrative and non-limiting detailed description of example embodiments, with reference to the appended drawings.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings.

That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1A:
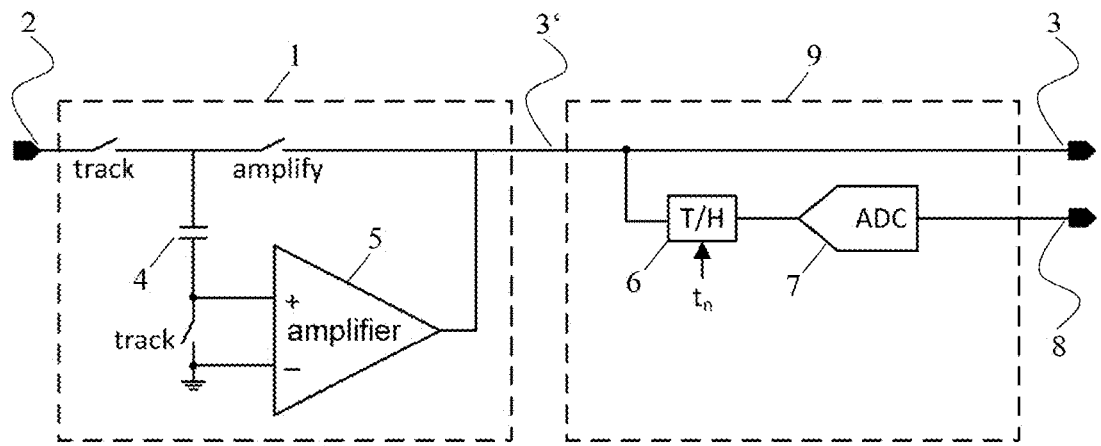
FIG. 1A illustrates a circuit for on-chip monitoring of a circuit under test.
Figure 1B:
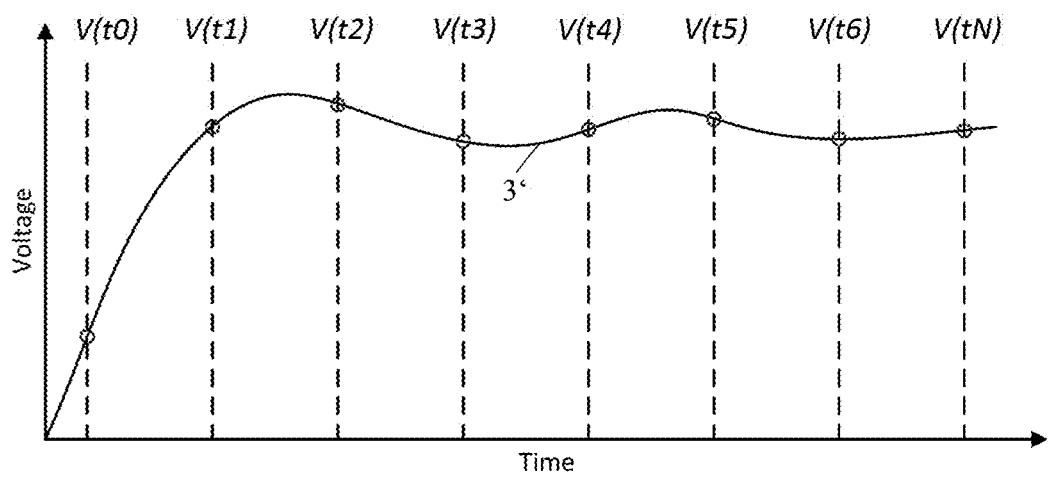
FIG. 1B illustrates a graphical representation of a sampling operation performed by the circuit of FIG. 1A, in accordance with an example embodiment.

FIGS. 1A and 1B illustrate a technique for on-chip monitoring of a circuit under test 1. Particularly, in FIG. 1A, a general implementation of a scope-on-chip monitor circuit 9 is shown to reconstruct the transient settling behavior of the circuit under test 1, e.g., a switched capacitor amplification circuit. The circuit under test 1 has an input terminal 2 and an output terminal 3. The monitoring circuit 9 is attached to the signal line and monitors the output signal 3' of the circuit under test 1. The circuit under test 1 generally comprises a switched capacitor arrangement 4 including an amplifier 5. The monitor circuit 9 consists of a track-and-hold (T/H) circuit 6 followed by an analog to digital converter (ADC) 7.

As shown in FIG. 1B, if this monitor circuit 9 samples the output of the amplifier 5 as it is settling across multiple points in time (t0-t7), a digitized representation of the amplifier's 5 transient settling behavior can be reconstructed. If all those samples are taken and quantized in a single operation period of the amplifier 5, then the tracking and processing speed requirements of the monitor circuit 9 will be much higher than that of the circuit under test 1 itself. This is often not practical to implement. However, if the input 2 of the circuit under test 1 is identical across multiple clock periods, for a memoryless system it is often a valid assumption that the output settling behavior will be nearly identical across these multiple cycles.

Especially due to this property, it then becomes possible to take only one sample with the monitor circuit 9 per amplification period and still reconstruct the transient waveform by combining data across an ensemble of periods of operation. For example, during a first period beginning at time, e.g., T0, the monitor circuit 9 can sample at time T0+t0. During a second period beginning at time, e.g., T1, the monitor circuit 9 can sample at time T1+t1, and so on. In this way, it is still possible to collect information about V(t0) through V(tN) by collecting them across multiple identical periods of operation.

However, the main problem with the general solution of FIG. 1A is that the monitor circuit 9 is too complex to be practically attractive as a "lightweight" calibration or monitoring solution. In particular, the entire settling waveform is usually sampled by the T/H 6, both signal and error. In general, the signal is much larger than the error, so in order to resolve the error effectively, a high-resolution ADC 7 is used.

Figure 2:
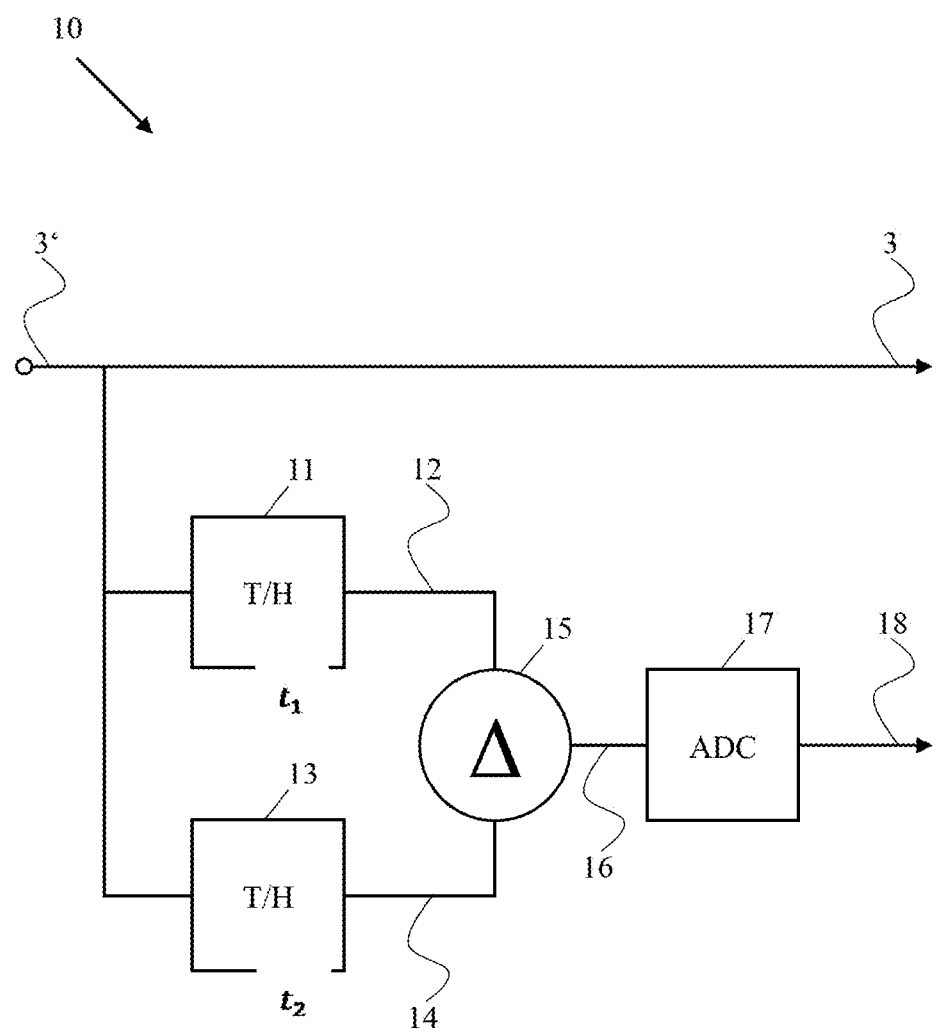
FIG. 2 illustrates an apparatus that facilitates the reconstruction of transient settling behavior, in accordance with an example embodiment.

FIG. 2 illustrates an example of the apparatus 10 according to the first aspect. The apparatus 10 comprises a first sampling circuit 11 and a second sampling circuit 13, where the sampling circuits (11 and 12) are realized, for instance, by means of track and hold (T/H) circuits. The first sampling circuit 11 tracks an analog signal output 3' from the circuit under test 1 over an operating period of the circuit under test 1 and samples it at a first sampling time $t_1$ in order to generate a first sample output 12. The second sampling circuit 13 analogously tracks the analog signal output 3' and samples it at a second sample time $t_2$ in order to generate a second sample output 14. In general, sampling is instantaneous, and thus the first sampling circuit 11 takes an instantaneous sample at the first sampling time $t_1$ of the analog signal output 3' that is tracked over time. Analogously, the second sampling circuit 13 takes an instantaneous sample at the second sample time $t_2$ of the tracked analog signal output 3'.

The apparatus 10 further comprises a signal subtraction circuit 15 followed by a signal conversion circuit 17, where the signal subtraction circuit 15 performs subtraction of the first sample output and the second sample output in order to generate a difference signal 16 or error signal. The difference signal 16 is then correspondingly converted by the signal conversion circuit 17 into digitized signal 18. Preferably, the signal conversion circuit 17 is realized by means of an analog to digital converter (ADC). In this case, the signal subtraction circuit 15 can be a stand-alone subtractor or may be integrated with the ADC 17, where such integration technique is known in the art and therefore is not described here in detail.

Figure 3:
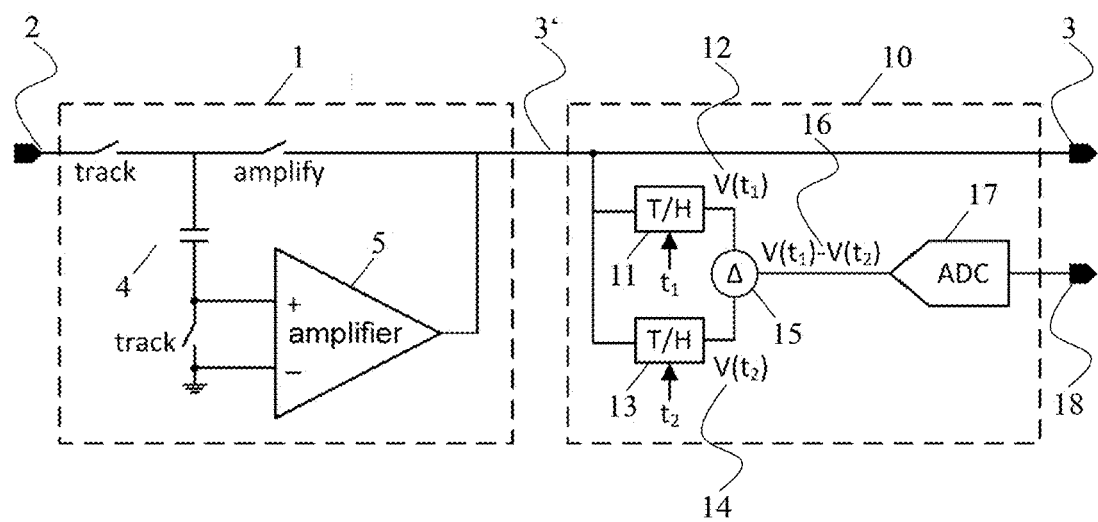
FIG. 3 illustrates an on-chip arrangement of the apparatus alongside the circuit under test, in accordance with an example embodiment.
Figure 4:
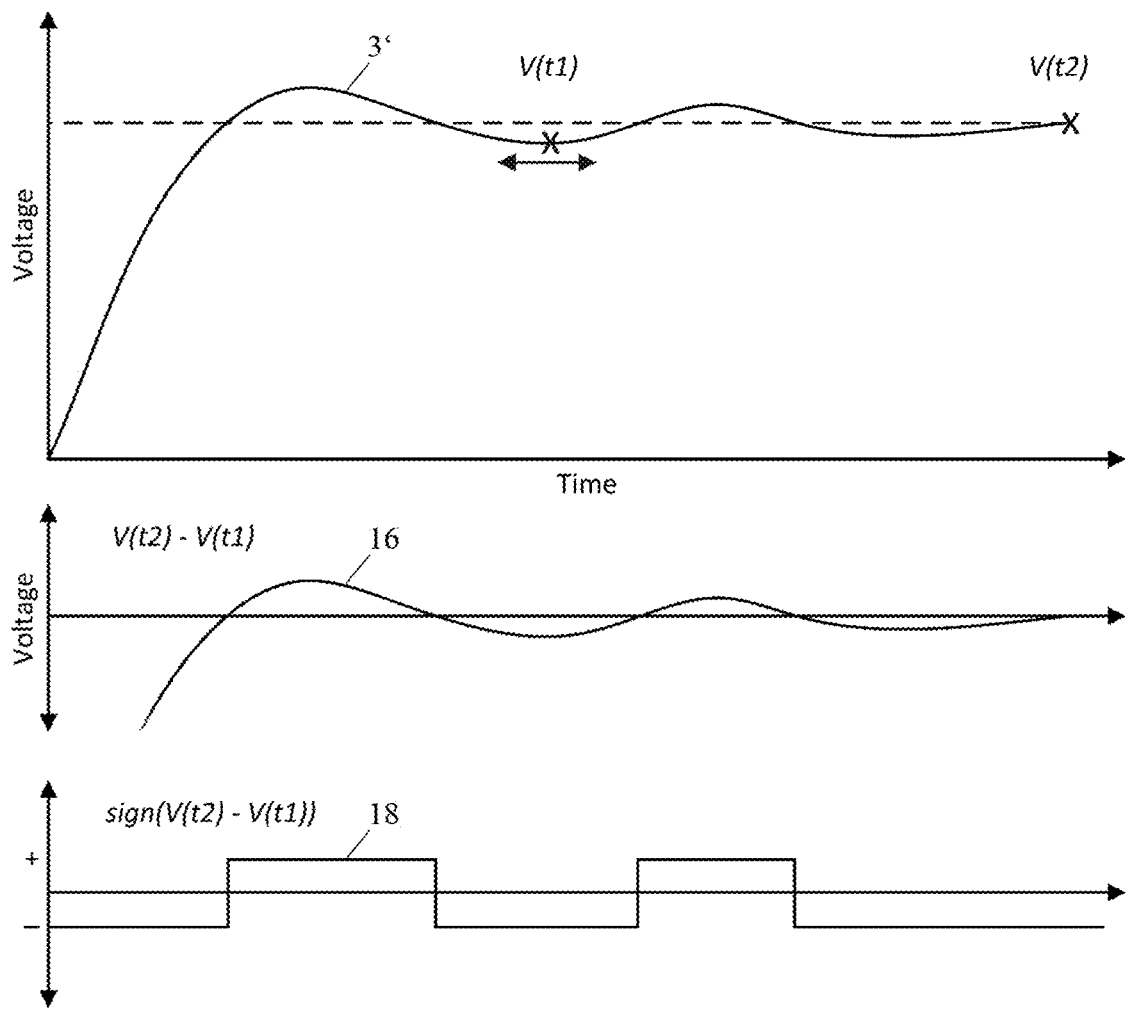
FIG. 4 illustrates a graphical representation of a sampling operation of the apparatus, in accordance with an example embodiment.

FIGS. 3 and 4 illustrate the on-chip background monitoring technique for the circuit under test 1, according to the first aspect. Particularly, in FIG. 3, a first exemplary on-chip arrangement of the apparatus 10 alongside the circuit under test 1 is shown. Similar to FIG. 1A, the circuit under test 1 is a switched capacitor amplification circuit having an input terminal 2 and an output terminal 3, where the apparatus 10 is attached to the signal line and monitors the output signal 3' of the circuit under test 1.

Due to the implementation of the first sampling circuit 11 and the second sampling circuit 13, it is possible to sample the transient waveform with respect to the final transient value. As shown in FIG. 4, for any given period of operation where the input condition to the amplifier 5 is constant, i.e., it is assumed that the output waveform is identical or at least similar from cycle-to-cycle, the first sampling circuit 11 samples during period N at some time $T_N+t_1$, where the value of $t_1$ is movable. The second sampling circuit 13 samples at the end of the period at time $T_N+t_2$, where the value of $t_2$ is fixed for all periods.

The second sample output 14, e.g., V(t2), thus serves as a reference voltage that represents the final settled value of the signal with the assumption that at the end of the period, the amplifier output 3' has settled. The sample outputs (12 and 14) of the respective sampling circuit (11 and 13) are then subtracted, such that the first sample output 12, e.g., V(t1) can be expressed in relative terms of V(t2). Since V(t2), in an example, contains only information pertaining to the signal, the input to the ADC 17, i.e., V(t1)–V(t2), thus contains only the information pertaining to the error 16. The signal 3' and the error 16 are illustrated in FIG. 4, respectively, along the first row and the second row.

The primary benefit of this arrangement is that the voltage provided to the ADC 17 in the apparatus 10 is now only the small residual error signal 16. The amplitude of this signal is small, so the input range and resolution of the ADC 17 are greatly relaxed compared to the general solution exemplified in FIG. 1A, because it is no longer necessary to quantize the small amplitude error 16 in the presence of a large amplitude signal, e.g., the output 3' the amplifier 5. Moreover, if the value of the sampling moment $t_1$ is varied across multiple periods where the same or at least similar signal is present, the transient waveform of the error signal 16 can be reconstructed as shown in FIG. 4.

In some cases, it may even be sufficient to extract the desired information using only a 1-bit ADC. For example, FIG. 4 illustrates how the output 18 of the ADC 17, and in an example, and in an example, a 1-bit ADC, provides information about the number of zero-crossings of the error waveform 16. For the case of monitoring the settling behavior of an amplifier 5, this is often a sufficiently informative output to be used to tune the amplifier 5 for near-optimum settling behavior. Such optimization can be carried out based on the output behavior, for instance, fewer zero-crossings correspond with more stable, more over-damped settling behavior, and more zero-crossings correspond with less stable, more under-damped settling behavior.

Moreover, if the amplitude of the error signal 16 is sufficiently small, it is also possible to operate the 1-bit ADC 17 as a stochastic ADC in order to increase the effective resolution. This can be achieved by exploiting the random noise in the apparatus 10, sampled across an ensemble of correlated operation periods, i.e., an ensemble of operation periods with settled output at a similar range, and thereby enhance the resolution of the ADC output 18.

It is to be noted that, for the conventional scope-on-chip monitoring circuit described in FIG. 1A, the full signal amplitude of the amplifier circuit's output 3' is sampled by the T/H 6. However, in the particular embodiment illustrated in FIGS. 2, 3, and 4, only the transient evolution of the settling error 16 is taken into consideration in order to monitor and optimize the settling behavior of the amplifier 5, which is minimized by the amplifier 5 feedback over time.

This settling error 16 is a much smaller amplitude than the overall total signal 3' and points to a major inefficiency in the monitoring circuit 9 of FIG. 1A, in order to digitize the small-amplitude settling error, the ADC 7 of the monitoring circuit 9 must have enough resolution to capture both the signal 3' and error 16 to sufficient precision. In other words, a high-resolution ADC 7 is required. The monitoring circuit, as illustrated herein, only relies on the sampling of the much smaller settling error 16, thus allowing for greatly relaxed performance requirements of the background on-chip monitoring.

Figure 5:
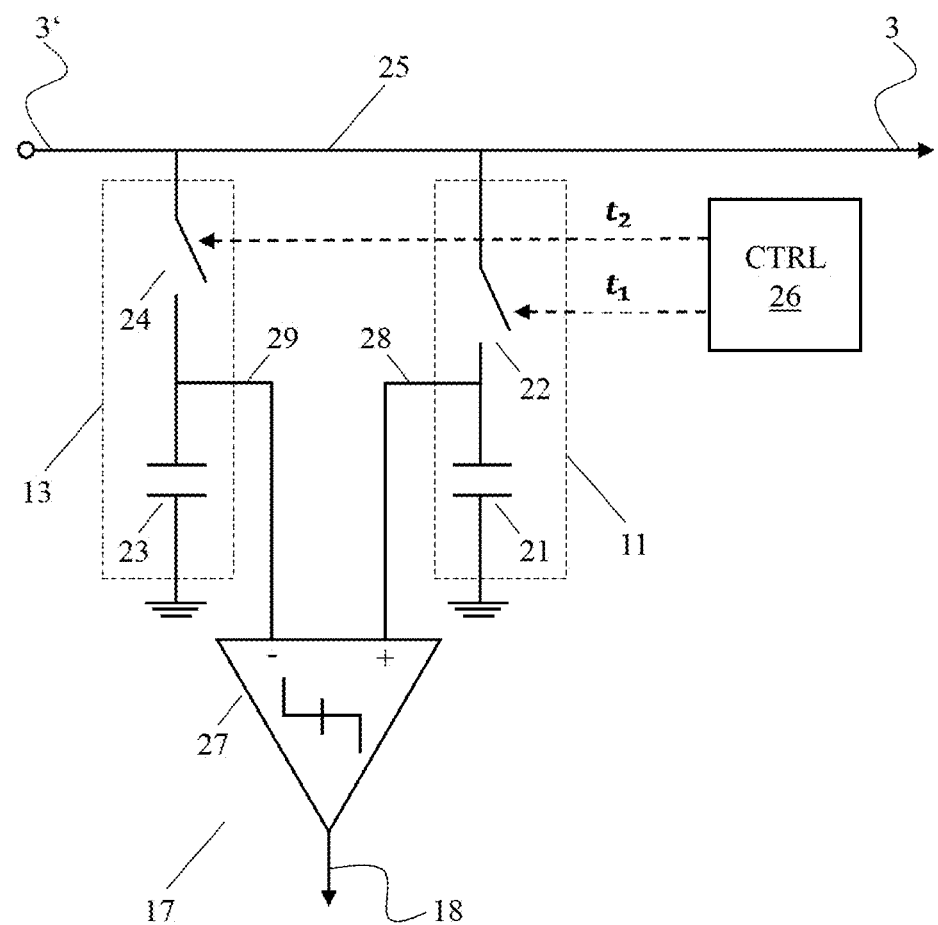
FIG. 5 illustrates a detailed view of the apparatus, in accordance with an example embodiment.

FIG. 5 illustrates a detailed view of the apparatus 10 according to the first aspect. Particularly, the internal arrangements of the sampling circuit (11 and 13) and of the ADC 17 are shown in detail. The first sampling circuit 11 comprises a sampling capacitor 21 followed by a sampling switch 22. Similarly, the second sampling circuit 13 comprises a sampling capacitor 23 followed by a sampling switch 24. The sampling circuit (11 and 13) are connected in parallel on the signal line that outputs the analog output 3', thereby forming a sampler frontend 25. The sampling times $t_1$, $t_2$ are generated by a controller 26 and are fed to the respective sampling switches (22 and 24) in order to grab and store the value of the samples at time $t_1$ and $t_2$ onto the sampling capacitors (21 and 23).

The ADC 17 is realized in the form of a single comparator 27 that compares the difference between the two sampled values at respective sampling times $t_1$ and $t_2$. The comparator 27 comprises a first input terminal 28 corresponding to the non-inverting input terminal and a second input terminal corresponding to the inverting input terminal or vice versa. The first input terminal 28 is connected to the first sampling circuit 11, particularly in-between the sampling capacitor 21 and the sampling switch 22. Analogously, the second input terminal 29 is connected to the second sampling circuit 13, particularly in-between the sampling capacitor 23 and the sampling switch 24.

Figure 6:
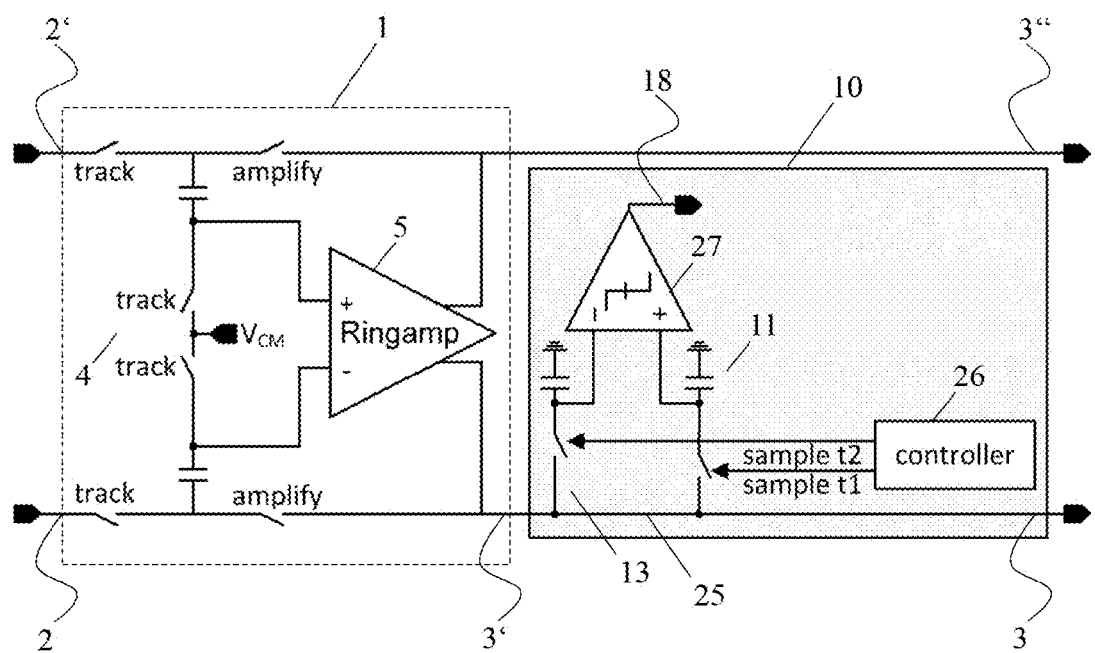
FIG. 6 illustrates a second exemplary on-chip arrangement of the apparatus alongside the circuit under test, in accordance with an example embodiment.

FIG. 6 illustrates a second example of an on-chip arrangement of the apparatus 10 alongside the circuit under test 1. In particular, the circuit under test 1 is shown in a differential arrangement where the apparatus 10 monitors only one output 3' of the differential circuit under test 1. Herein, the circuit under test 1 is considered as a distinguished stage of a pipelined ADC, realized with ring amplifiers 5 and where the apparatus 10 is placed at the output 3' of each stage of the pipelined ADC. Ideally, the apparatus 10 acts as a monitoring circuit for the pipelined ADC, and in an example, as a zero-crossing counter in order to identify the stability of the ring amplifier's settling behavior and then to utilize that information to tune the stability to the desired behavior.

The switched capacitor voltage follower based on a ring amplifier 5 circuit under test 1 has complementary inputs (2 and 2') (e.g., $IN_m$ and $IN_p$ respectively) and outputs (3 and 3'') (e.g., $OUT_m$ and $OUT_p$ respectively). The sampler frontend 25 of the apparatus 10 is connected to the signal line conveying the output signal 3' of the circuit under test 1. However, it is also possible to arrange the apparatus 10 on the complementary signal line in-between the complementary signal input $IN_p$ and complementary output $OUT_p$ of the circuit under test 1. Ideally, the output 3' herein of the circuit under test 1 corresponds to the normal output 3 of the circuit under test, e.g., $OUT_m$ of the circuit under test 1.

Generally, the ring amplifier or ring-amp 5 is a high-performance, high-efficiency switched capacitor amplifier technique that is broadly applicable to advanced nanoscale CMOS technologies across a range of applications. It operates based on principles of dynamic stabilization. As such, it is essential to ensure that the ring-amp 5 does indeed settle in a stable manner across all process, voltage, and temperature (PVT) variations. The apparatus 10 specifically measures the ring-amp's transient settling behavior in the background during normal operation, which can be further utilized to adjust the biasing of the ring-amp 5 to maintain near-optimal performance across all PVT variations.

Figure 7A:
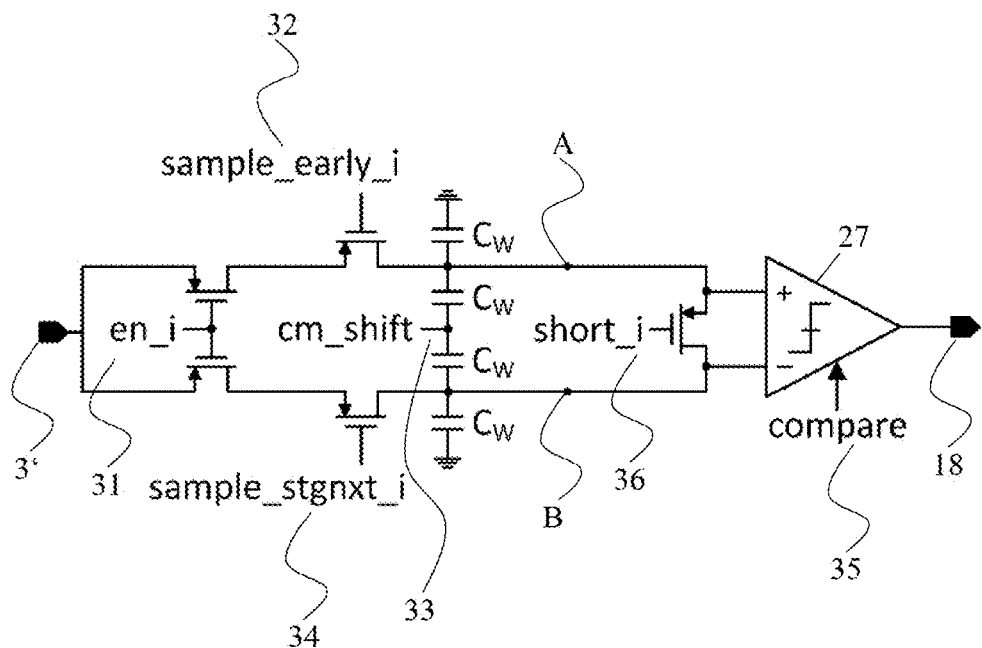
FIG. 7A illustrates a further detailed representation of the apparatus with signaling operations, in accordance with an example embodiment.
Figure 7B:
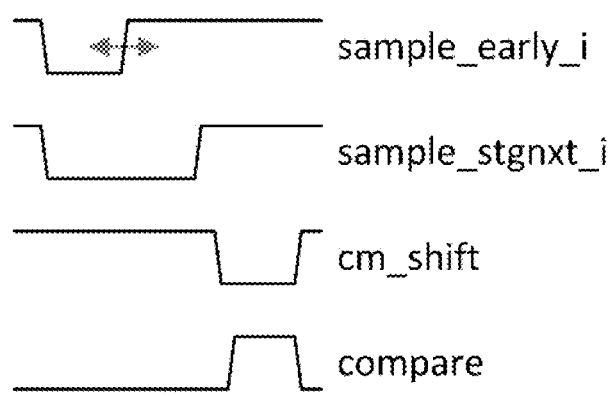
FIG. 7B illustrates an exemplary timing diagram for the signaling operations of FIG. 7A, in accordance with an example embodiment.

FIGS. 7A and 7B illustrate a further detailed representation of the apparatus 10 with example signaling operations. In particular, a single-ended monitoring circuit of one of the amplifier's output node $OUT_m$, $OUT_p$ is shown herein due to practical considerations. However, a fully-differential implementation of the monitoring circuit is also possible.

In order to sample the final sample output 14, e.g., V(t2) without negatively affecting the sampling fidelity of the succeeding pipelined stage of the pipelined ADC, the output 3' of the circuit under test 1 is required to be sampled at exactly the same moment as the pipelined ADC, for instance, fed by a primary sampler. This is accomplished by using the same physical wire to also drive the second sampling circuit 13.

The signaling operations are performed by the controller 26, which includes logic and timing circuitry for operating the apparatus 10. For example, when the apparatus 10 is enabled, the controller 26 will enforce an initiating signal 31, e.g., en_i, to zero. The upper sampling path is timed by a programmable time delay in the controller 26 that drives the sampling signal 32, e.g., sample_early_i. This path obtains the unsettled output value V(t1) and stores it across two capacitors Cw at node A, as it happens with a wire and its parasitic capacitor on both sides. The lower sampling path is timed by an externally provided sample signal 34, e.g., sample_stgnxt_i, which is the same signal on the same physical wire as the primary sampler located nearby in the layout. This path obtains the final output value V(t2), stored across two capacitors Cw at node B.

After both paths have been sampled, the controller 26 de-asserts a common-mode signal 33, e.g., cm_shift, which lowers the common-mode presented to the two input terminals (28 and 29) of the comparator 27. Since the comparator 27 is implemented with a PMOS input pair, this lowering of the common-mode speeds up the comparison procedure, and shortly after cm_shift de-asserts, the signal compare 35 is asserted, which initiates a comparison. The controller 26 can also use the short_i signal 36 to short nodes A and B together prior to comparison, which allows the tunable-threshold comparator 27 to be adjusted such that the apparatus input 3' referred offset is canceled.

FIG. 7B illustrates an example of the timing operations of the controller 26. The timing for the control signals sample_early_i, sample_stgnxt_i, cm_shift, and compare are respectively shown, which are generated by the controller 26.

Figure 8A:
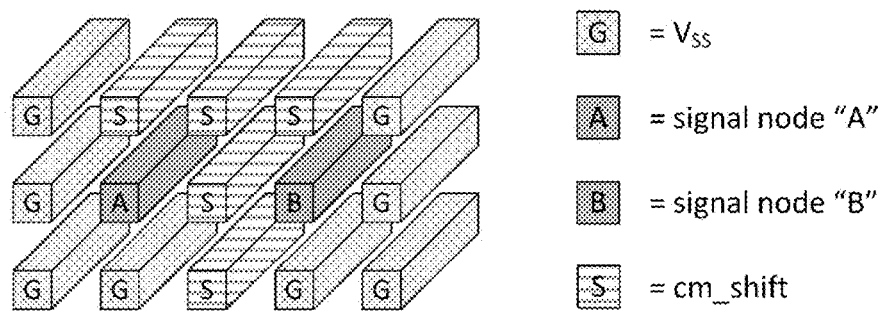
FIG. 8A illustrates a sectional view of a wire routing for realizing sampling capacitors, in accordance with an example embodiment.
Figure 8B:
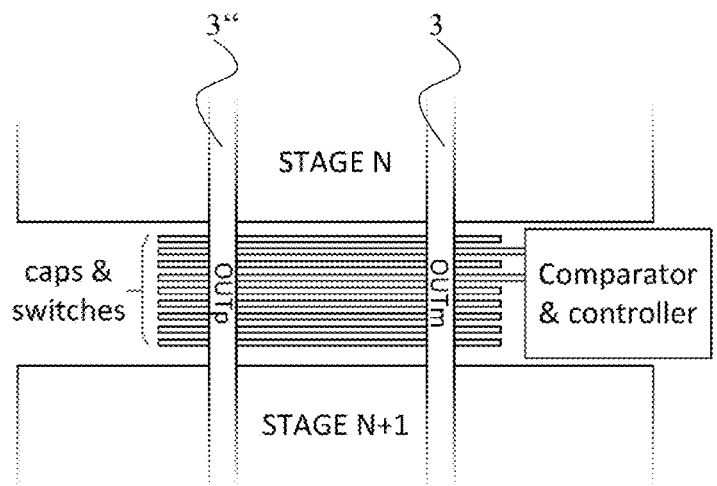
FIG. 8B illustrates a sectional view of a wire routing in multiple-staged pipelined ADC, in accordance with an example embodiment.

FIGS. 8A and 8B illustrate an example of the wire routing for realizing sampling capacitors Cw. Ideally, the apparatus 10 should have as little effect as possible on the analog performance behavior of the circuit under test 1 and signal path. In particular, this means minimizing the kickback that the apparatus 10 injects, and minimizing the capacitive loading that it adds to the circuit under test 1. Both of these drawbacks can be effectively minimized by keeping the sampling circuit (11 and 13) of the apparatus 10 as small as possible, particularly for both the switches (22 and 24) and capacitors (21 and 23).

When operating the apparatus 10 and operating the ADC 17 as a 1-bit stochastic ADC, thermal noise is not a limitation in the sizing of the sampling capacitors (21 and 23). Even when using the ADC 17 in a non-stochastic way, averaging of quantized results across many samples can be used to eliminate noise in the reconstruction. Therefore, it may be worthwhile to minimize the size of the sampling capacitors (21 and 23) as much as possible.

In order to achieve this, the wire capacitors Cw of FIG. 7A are formed with the wiring that connects the nodes to be monitored, e.g., 3', to the apparatus 10. Hence, there is no explicit matched capacitor layout, it is implicit in the way that the signals are routed. This also leads to a very compact layout. The signal wires, e.g., respecting the nodes A and B, are coupled into adjacent wires connected to ground and cm_shift. Approximately half of the total coupling is to each wire capacitor Cw such that the total capacitance is 2Cw. The sampling switches (22 and 24) are placed below this wire capacitor routing stack, located at the point of intersection with the signal lines to be monitored, e.g., $OUT_p$ and $OUT_m$.

Figure 9:
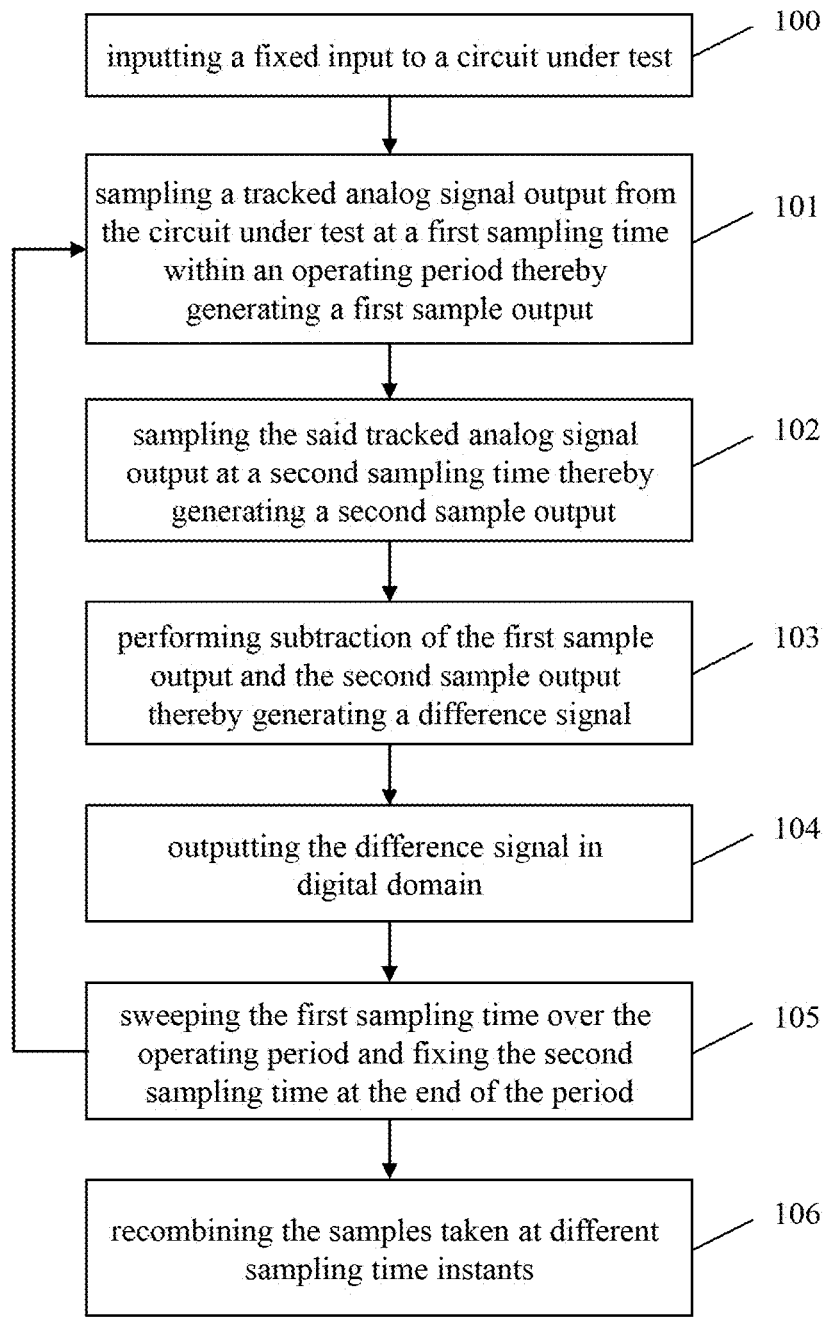
FIG. 9 illustrates a first implementation of the method according to the second aspect, in accordance with an example embodiment.

FIG. 9 illustrates a first example of the method according to the second aspect. In a first step 100, a fixed input is inputted to a circuit under test. In a second step 101, a tracked analog signal output from a circuit under test is sampled at a first sampling time within an operating period, thereby generating a first sample output. In a third step 102, the tracked analog signal output is sampled at a second sampling time, thereby generating a second sample output. In a fourth step 103, a subtraction of the first sample output and the second sample output is performed, thereby generating a difference signal. In a fifth step 104, the difference signal is outputted in the digital domain. In a sixth step 105, the first sampling time is swept over the operating period and the second sampling time is fixed at the end of the period. In a seventh step 106, the samples taken at different sampling time instants are recombined. In particular, steps 101 to 104 are performed iteratively to perform noise filtration during the monitoring operation. Moreover, step 105 is also performed iteratively such that at an arbitrary but pre-defined sampling time instance, a number of samples are taken iteratively and are averaged. Then the first sampling time is moved to the next arbitrary but pre-defined sampling time instance until the whole waveform is reconstructed.

Figure 10:
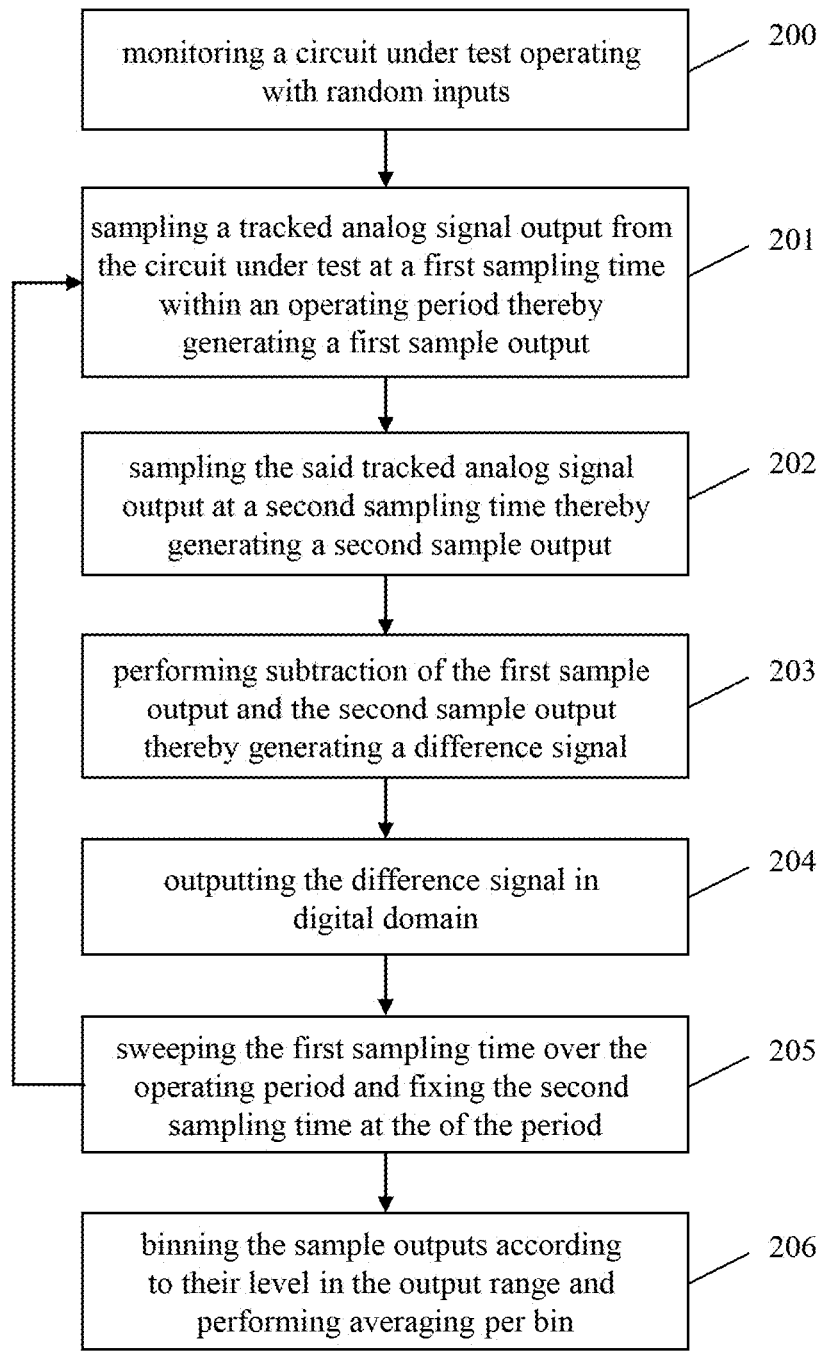
FIG. 10 illustrates a second implementation of the method according to the second aspect, in accordance with an example embodiment.

FIG. 10 illustrates a second example of the method according to the second aspect. In a first step 200, a circuit under test operating with random inputs is monitored. In a second step 201, a tracked analog signal output from a circuit under test is sampled at a first sampling time within an operating period, thereby generating a first sample output. In a third step 202, the tracked analog signal output is sampled at a second sampling time, thereby generating a second sample output. In a fourth step 203, a subtraction of the first sample output and the second sample output is performed, thereby generating a difference signal. In a fifth step 204, the difference signal is outputted in the digital domain. In a sixth step 205, the first sampling time is swept over the operating period and the second sampling time is fixed at the end of the period. In a seventh step 206, the sample outputs are binned according to their level in the output range and the averaging is performed per bin. In particular, steps 201 to 204 are performed iteratively to perform noise filtration during the monitoring operation. Moreover, step 205 is also performed iteratively such that at an arbitrary but pre-defined sampling time instance, a number of samples are taken iteratively and are averaged. Then the first sampling time is moved to the next arbitrary but pre-defined sampling time instance until the whole waveform is reconstructed.

It is to be noted that the monitoring circuit illustrated herein can be viewed from the perspective of transient waveform capture technique, where a solution is presented for a lightweight and highly practical in-situ integrated circuit implementation that is relevant for a number of practical applications, including the application of interest described in the above-mentioned embodiments. On the other hand, certain aspects of the application can be viewed from the perspective of the application of interest itself, namely: feedback system stability monitoring, and in particular, ring-amp-based circuit optimization.

The particular problem addressed herein corresponds to a solution for the reconstruction of the transient settling behavior at the output of an amplifier in a switched capacitor feedback circuit. One drawback of common background monitoring techniques is that the full output waveform is sampled and quantized. Since the majority of this amplitude is the final settled signal itself, this requires a measuring ADC with high resolution. The aspects herein present an alternate approach for sampling in a way that the sampled signals are subtracted and only the relative error in the transient settling behavior is quantized. This allows for a low-resolution measuring ADC, even as low as 1 bit.

The embodiments of the aspects above can be implemented by hardware, software, or any combination thereof. Various embodiments may be implemented by one or more application-specific integrated circuits (ASICs), digital signal processors (DSPs), digital signal processing devices (DSPDs), programmable logic devices (PLDs), field-programmable gate arrays (FPGAs), processors, controllers, microcontrollers, microprocessors, or the like.

While various embodiments have been described above, it should be understood that they have been presented by way of example only, and not limitation. Numerous changes to the disclosed embodiments can be made in accordance with the disclosure herein without departing from the spirit or scope of the claims. Thus, the breadth and scope of the claims should not be limited by any of the above-described embodiments.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the

What is claimed is:

1. An apparatus for on-chip reconstruction of transient settling behavior comprising:
    a first sampling circuit configured to sample a tracked analog signal output from a circuit under test over an operating period at a first sampling time, thereby generating a first sample output;
    a second sampling circuit configured to sample the tracked analog signal output at a second sampling time, thereby generating a second sample output;
    a signal subtraction circuit in communication with the first sampling circuit and the first sampling circuit and configured to perform subtraction of the first sample output and the second sample output, thereby generating a difference signal; and
    a signal conversion circuit configured to output the difference signal in a digital domain, wherein the first sampling time is tunable over the operating period at a plurality of sampling moments in time and the second sampling time is fixed at an end point of the operating period.

2. The apparatus according to claim 1, wherein the first sample output and the second sample output are repeatedly generated and recombined across a plurality of operating periods, thereby reconstructing the transient settling behavior of the circuit under test.

3. The apparatus according to claim 2, wherein the circuit under test is a discrete-time switched capacitor circuit comprising an amplifier, whereby the apparatus is configured to be implemented in-situ alongside an integrated circuit.

4. The apparatus according to claim 1, wherein the circuit under test is an integrated circuit, whereby the apparatus is configured to be implemented in-situ alongside the integrated circuit.

5. The apparatus according to claim 4, wherein the tracked analog signal output corresponds to a transient waveform output from an amplifier of the circuit under test, wherein the amplifier is configured to receive different signals having substantially similar transient settling time characteristics.

6. The apparatus according to claim 5, wherein the first sample output represents a transient value at an arbitrary time instant and the second sample output represents a final transient value of the transient waveform over the operating period.

7. The apparatus according to claim 6, wherein the signal conversion circuit is an analog to digital converter.

8. The apparatus according to claim 7, wherein the analog to digital converter is a 1-bit analog to digital converter.

9. The apparatus according to claim 1, wherein the signal conversion circuit is an analog to digital converter.

10. The apparatus according to claim 9, wherein the analog to digital converter comprises a single comparator having a first input and a second input respectively conveying the first sample output and the second sample output.

11. The apparatus according to claim 1, wherein the apparatus further comprises a controller configured to provide the first sampling time and the second sampling time in order to operate the first sampling circuit and the second sampling circuit, respectively.

12. The apparatus according to claim 1, wherein the first sampling circuit and the second sampling circuit each comprise at least one sampling switch and at least one sampling capacitor, whereby the at least one sampling capacitor is formed with signal lines conveying the tracked analog signal output from the circuit under test.

13. The apparatus according to claim 1, wherein the sample outputs are repeatedly generated and recombined across a plurality of operating periods, thereby reconstructing the transient settling behavior of the circuit under test.

14. The apparatus according to claim 1, wherein the apparatus further comprises a controller configured to provide the first sampling time and the second sampling time in order to operate the first sampling circuit and the second sampling circuit, respectively.

15. A method for on-chip reconstruction of transient settling behavior comprising:
    sampling a tracked analog signal output from a circuit under test over an operating period at a first sampling time, thereby generating a first sample output;
    sampling the tracked analog signal output at a second sampling time, thereby generating a second sample output;
    performing subtraction of the first sample output and the second sample output, thereby generating a difference signal; and
    outputting the difference signal in a digital domain,
    wherein the first sampling time is tunable over the operating period at a plurality of sampling moments in time and the second sampling time is fixed at an end point of the operating period.

16. The method according to claim 15, further comprising repeatedly generating and combining the sampling outputs across a plurality of operating periods, thereby reconstructing the transient settling behavior of the circuit under test.

17. The method according to claim 15, further comprising generating the first sample output and the second sample output for different signals having substantially similar transient settling time characteristics that are input to the circuit under test.

18. The method according to claim 15, further comprising generating the first sample output and the second sample output for random inputs to the circuit under test and whereby the sample outputs are binned according to their level and the averaging is performed per bin.

* * * * *